(12) United States Patent
Choi et al.

(10) Patent No.: US 6,492,088 B1
(45) Date of Patent: Dec. 10, 2002

(54) PHOTORESIST MONOMERS POLYMERS THEREOF AND PHOTORESIST COMPOSITIONS CONTAINING THE SAME

(75) Inventors: Jae Hak Choi, Kyoungki-do (KR); Myung Goon Gil, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 120 days.

(21) Appl. No.: 09/686,548

(22) Filed: Oct. 11, 2000

(30) Foreign Application Priority Data

Oct. 11, 1999 (KR) .............................. 99-43843

(51) Int. Cl.[7] .............................................. G03F 7/039
(52) U.S. Cl. ................................. 430/270.1; 430/910
(58) Field of Search .............................. 430/270.1, 910

(56) References Cited

U.S. PATENT DOCUMENTS 6,303,266 B1 * 10/2001 Okino et al. ............. 430/270.1

* cited by examiner

*Primary Examiner*—John S. Chu
(74) *Attorney, Agent, or Firm*—Townsend and Townsend and Crew LLP

(57) ABSTRACT

The present invention provides novel photoresist monomers, and photoresist polymers comprising the same. The photoresist monomer of the present invention is selected from the group consisting of compounds of the formulas:

Chemical Formula 2a

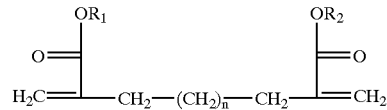

Chemical Formula 2b

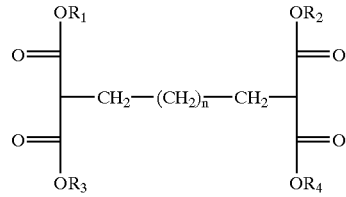

wherein $R_1$ to $R_4$ and n are those defined herein. The photoresist compositions comprising the photoresist polymers of the present invention have high transparency in a deep ultraviolet light region, and also have excellent etching resistance, heat resistance, sensitivity, adhesiveness and resolution. Accordingly, the photoresist composition is suitable for lithography process using a deep ultraviolet light sources such as ArF, KrF, VUV, EUV, E-beam and X-ray for fabricating minute circuit of a high integration semiconductor device.

18 Claims, 1 Drawing Sheet

PHOTORESIST MONOMERS POLYMERS THEREOF AND PHOTORESIST COMPOSITIONS CONTAINING THE SAME

BACKGROUND OF THE INVENTION

1. Field of the Invention

The present invention relates to photoresist monomers, polymers derived therefrom and photoresist compositions comprising the polymers. In particular, the present invention relates to polycarbonyl-derivative photoresist monomers, polymers thereof and photoresist compositions comprising the same that are suitable for photolithography processes employing KrF, ArF, VUV, EUV and similar light sources.

2. Description of the Background Art

Recently, chemical amplification-type DUV photoresists have been investigated in order to increase sensitivity in minute image formation processes for preparing semiconductor devices. Such photoresists are prepared by blending a photoacid generator and matrix resin polymer having an acid labile group.

In a photolithography process, an exposure of photoresist to light of a particular wavelength generates an acid from the photoacid generator that is present in the photoresist. The photo generated acid causes the main chain or the branched chain of the resin to decompose or become cross-linked. In addition, the acid removes the acid labile group and changes the polarity of the photoresist in the exposed region. This polarity change creates a solubility difference between the exposed portion and the unexposed portion in a developing solution, thereby allowing a pattern formation. The resolution of the pattern that is formed depends on the wavelength of the light source, i.e., in general, a shorter wavelength allows formation of more minute patterns.

In general, a useful photoresist (hereinafter, abbreviated as "PR") has a variety of desired characteristics, such as excellent etching resistance, heat resistance and adhesiveness. In addition, a photoresist should be easily developable in a commercially readily available developing solution, such as 2.38 wt % aqueous tetramethylammonium hydroxide (TMAH) solution. However, it is very difficult to synthesize a photoresist polymer that satisfies all of these requisites.

To solve some of the problems described above, there has been developed a three-component PR composition comprising a polymer of Chemical Formula 1, prepared by cyclopolymerization of 2-(tert-butoxycarbonyl)bicyclo-2,5-diene, as a matrix resin; and a lithocholic ester compound as a dissolution inhibitor:

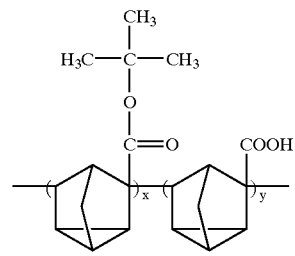

Chemical Formula 1

Although the polymer has excellent dry etching resistance, it requires an excess amount of the dissolution inhibitor which is transparent in the wavelength of 193 nm. Unfortunately, the excess amount of the dissolution inhibitor may result in precipitation or lowering of the glass transition temperature ($T_g$). Thus, the above described three component mixture does not provide a satisfactory solution to the problems. Also, in order to improve the adhesiveness of the PR polymer to the wafer, the ratio of 'y' must be increased. However, if the amount of 'y' is increased, the developing solution (2.38 wt % TMAH) cannot be employed.

SUMMARY OF THE INVENTION

Accordingly, it is an object of the present invention to provide photoresist monomers having excellent etching resistance, adhesiveness and photosensitivity.

Another object of the present invention is to provide PR polymers derived from such photoresist monomers and methods for preparing the same.

Yet another object of the present invention is to provide photoresist compositions comprising such PR polymers.

Still another object of the present invention is to provide a semiconductor device produced by using the above described PR composition.

DETAILED DESCRIPTION OF THE PREFERRED EMBODIMENTS

Figure 1:
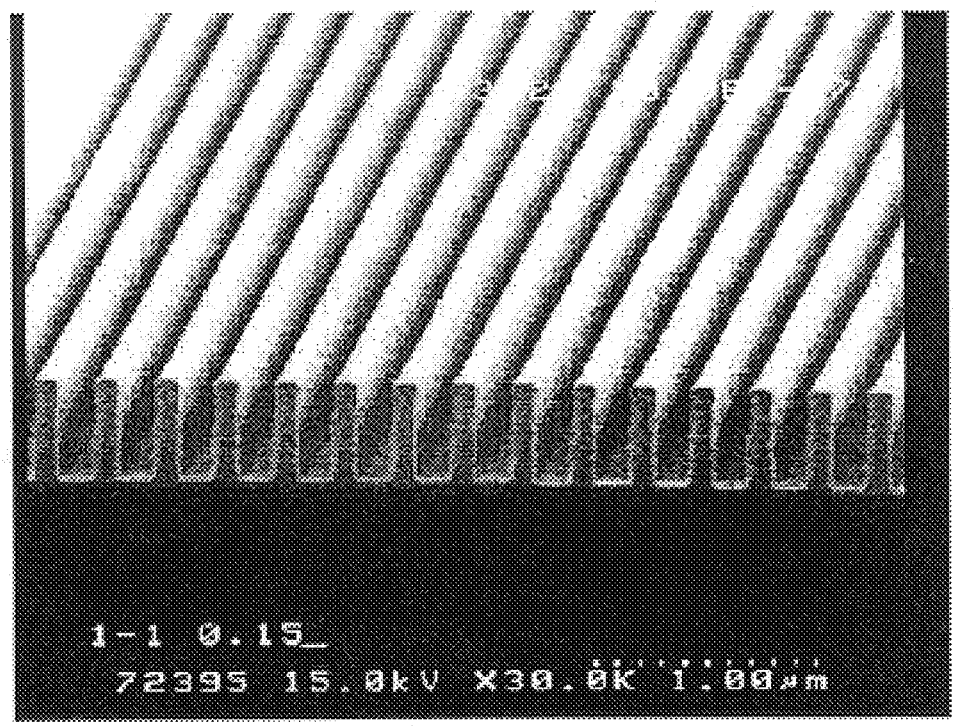
FIG. 1 shows a photoresist pattern obtained in Example 1.

The present invention provides novel photoresist monomers, which achieve the above-stated objectives. The present invention also provides photoresist polymers derived from such photoresist monomers, and a process for preparing the same. The present invention also provides for a photoresist composition comprising such PR polymers and a semiconductor device fabricated by using such PR compositions.

In one particular aspect, the present invention provides a photoresist monomer selected from the group consisting of di-carbonyl compounds of the formula:

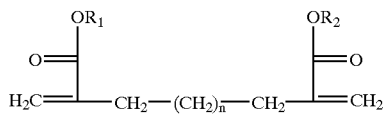

(2a)

and tetra-carbonyl compounds of the formula:

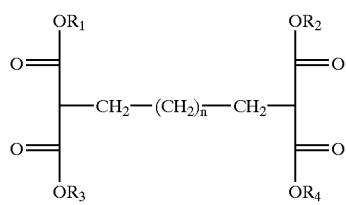

(2b)

wherein,
$R_1$ is an acid labile protecting group,
$R_2$ to $R_4$ are independently H, or an acid labile protecting group; and
n is an integer from 1 to 3.

The above acid labile protecting groups are preferably a moiety of the formula

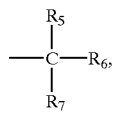

tetrahydropyran-2-yl or tetrahydrofuran-2-yl; wherein $R_5$ to $R_7$ are independently H, $C_1$–$C_3$ alkyl, alkoxy or hydroxyalkyl, Examples of preferred monomer of the present invention include, but are not limited to:

tetraethyl 1,1,5,5-pentanetetracarboxylate:

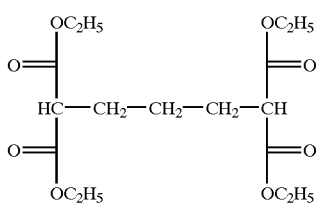

(3)

diethyl α,α'-dicarboxypimelate:

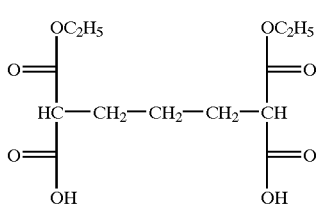

(4)

diethyl α,α'-dimethylenepimelate:

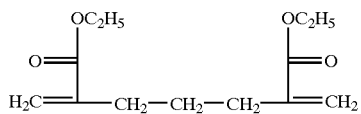

(5)

di-tert-butyl α,α'-dimethylenepimelate:

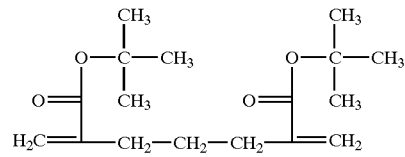

(7)

di-1-ethoxyethyl α,α'-dimethylenepimelate:

(8)

di-1-ethoxy-1-methylethyl α,α'-dimethylenepimelate:

(9)

di(tetrahydropyran-2-yl) α,α'-dimethylenepimelate:

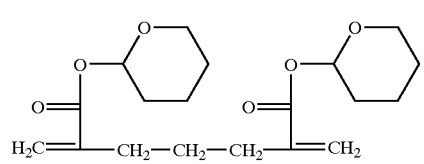

(10)

The present invention also provides a photoresist polymer comprising at least one compound selected from the group consisting of di-carbonyl compounds of Formula 2a and tetra-carbonyl compounds of Formula 2b.

The photoresist polymer can further comprise a monomer of Chemical Formula 19:

Chemical Formula 19

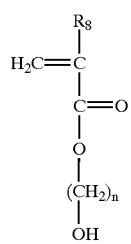

wherein $R_8$ is hydrogen or alkyl, preferably methyl, and n is an integer from 1 to 8.

The monomer of Chemical Formula 19 improves the adhesiveness of photoresist polymer to the substrate.

The photoresist polymer can further comprise a monomer of Chemical Formula 6:

Chemical Formula 6

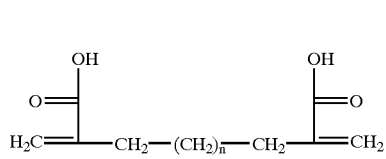

wherein n is an integer from 1 to 3.

Preferable example of the monomer of Chemical Formula 6 is α,α'-dimethylenepimelic acid of Chemical Formula 6a:

Chemical Formula 6a

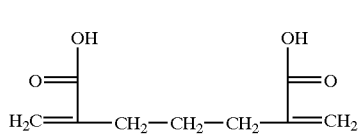

The photoresist polymer of the present invention is prepared by cyclopolymerization leading to alicyclic structures in its main chain, which results in high transparency in the wavelength of 193 nm and excellent dry etching resistance.

Preferably, molecular weight of the present photoresist polymer is from about 3,000 to about 100,000.

Preferred polymers of the present invention include:

poly(di-tert-butyl α,α'-dimethylenepimelate) of Chemical Formula 11;

Chemical Formula 11

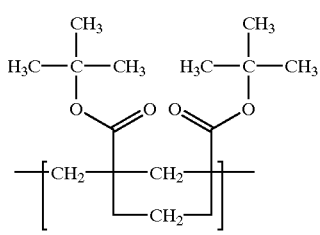

poly(di-1-ethoxyethyl α,α'-dimethylenepimelate) of Chemical Formula 12:

Chemical Formula 12

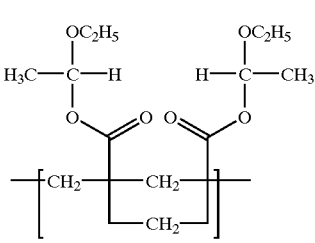

poly(di-1-ethoxy-1-methylethyl α,α'-dimethylenepimelate) of Chemical Formula 13:

Chemical Formula 13

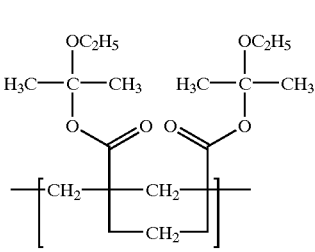

poly[di(tetrahydropyran-2-yl) α,α'-dimethylenepimelate] of Chemical Formula 14:

Chemical Formula 14

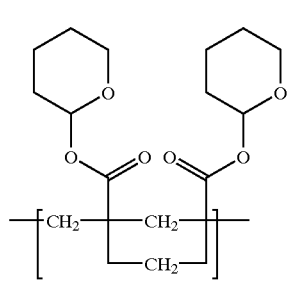

poly(di-tert-butyl α,α'-dimethylenepimelate-co-α,α'-dimethylenepimelic acid) of Chemical Formula 15:

Chemical Formula 15

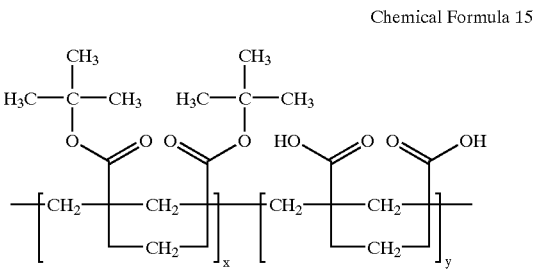

poly(di-1-ethoxyethyl α,α'-dimethylenepimelate-co-α,α'-dimethylenepimelic acid) of Chemical Formula 16:

Chemical Formula 16

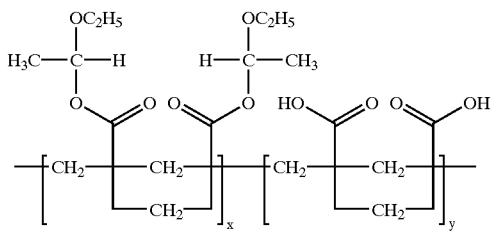

poly(di-1-ethoxy-1-methylethyl α,α'-dimethylenepimelate-co-α,α'-dimethylenepimelic acid) of Chemical Formula 17:

Chemical Formula 17

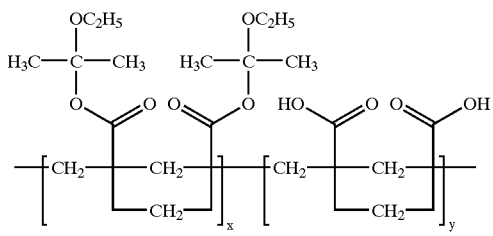

poly[di(tetrahydropyranyl)-α,α'-dimethylenepimelate-co-α,α'-dimethylenepimelic acid] of Chemical Formula 18:

Chemical Formula 18

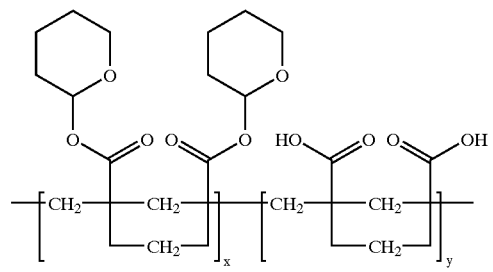

wherein, x and y represent the relative amounts of each monomer, and x: y is 0.01–99.99 mol %: 99.99–0.01 mol %.

Polymers of the present invention can be prepared by any of the methods known to one of ordinary skill in the art, including by a radical polymerization of monomers with a conventional radical polymerization initiator. An exemplary procedure for preparing polymers of the present invention includes the steps of:

(a) admixing, preferably in an organic solvent, one or more monomers selected from the group consisting of the compounds of Chemical Formulas 2a and 2b; and a polymerization initiator; and (b) heating the admixture under an inert atmosphere.

The above radical polymerization is cyclopolymerization.

Preferably, the organic solvent for polymerization is selected from the group consisting of cyclohexanone, tetrahydrofuran, dimethylformamide, dimethylsulfoxide, dioxane, methyl ethyl ketone, benzene, toluene and xylene.

Exemplary polymerization initiator include any conventional radical polymerization initiators such as 2,2'-azobisisobutyronitrile (AIBN), acetyl peroxide, lauryl peroxide, tert-butyl peracetate, tert-butyl hydroperoxide and di-tert-butyl peroxide and benzoyl peroxide.

The present invention also provides a photoresist composition comprising a photoresist polymer described herein, an organic solvent and a photoacid generator.

As described above, polymers of the present invention comprise one or more polymeric units derived from the group consisting of compounds of formulas 2a and 2b. In addition to units derived from these monomers, polymers of the present invention can further comprise one or more polymeric units derived from the compound of formula 19.

Preferred photoacid generators include sulfides and onium type compounds. In one particular embodiment of the present invention, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate. Typically, the amount of photoacid generator used is from about 0.05% by weight to about 10% by weight of the photoresist resin employed. It has been found that when the photoacid generator is used in the amount less than about 0.05%, it lowers photosensitivity of the PR composition, and when the photoacid generator is used in the amount greater than about 10%, it results in a poor pattern formation due to its high absorption of DUV (Deep Ultra Violet).

Exemplary organic solvents suitable in PR compositions of the present invention include methyl 3-methoxypropionate, ethyl 3-ethoxypriopionate, propylene glycol methyl ether acetate and cyclohexanone. The amount of solvent used is preferably in the range of from about 100% to about 1000% by weight of the PR polymer. This ratio has been found to be particularly useful in obtaining a photoresist layer of a desirable thickness when coated on to a suitable substrate such as a silicon wafer in production of a semiconductor element.

The PR composition prepared by the present invention has an excellent etching resistance, adhesiveness and heat resistance.

Another embodiment of the present invention provides a method for forming the PR pattern as follows: (a) coating the above described photoresist composition on a substrate of semiconductor element to form a photoresist film; (b) exposing the photoresist film to light using a light source; and (c) developing the photoresist film, for example, using an alkaline solution such as 2.38 wt % TMAH solution. Optionally, the photoresist film can be heated (i.e., baked), preferably to temperature in the range of from about 70 ° C. to about 200° C., before and/or after the step (b).

Exemplary light sources which are useful for forming the PR pattern include ArF (193 nm), KrF (248 nm), VUV (157 nm), EUV, E-beam, X-ray and ion beam. Preferably, the irradiation energy is in the range of from about 1 mJ/cm$^2$ to about 100 mJ/cm$^2$.

The present invention also provides a semiconductor device, which is manufactured using the photoresist composition described above.

Additional objects, advantages, and novel features of this invention will become apparent to those skilled in the art upon examination of the following examples thereof, which are not intended to be limiting.

I. Preparation of Photoresist Monomers

EXAMPLE 1

Synthesis of tetraethyl 1,1,5,5-pentanetetracarboxulate

To a 3 L reaction vessel was added 23 g of sodium and 500 mL of ethanol. The solution was cooled and 972 g of diethyl malonate was slowly added.

The resultant solution was heated, and 101 g of trimethylene bromide was slowly added thereinto for 3 hours. The mixture was refluxed for 12 hours, and distilled under reduced pressure to separate ethanol. Thereafter, distilled water containing a few drops of sulfuric acid was slowly added thereinto, and the resultant solution was stirred to remove sodium bromide. The resultant solution was extracted by using ether, an organic solution layer was dried over magnesium sulfate, and ether was removed under reduced pressure. The resultant solution was fractionally distilled under reduced pressure to remove diethyl malonate, thereby obtaining the title compound of Chemical Formula 3 (yield: 81%, 146 g).

EXAMPLE 2

Synthesis of diethyl α,α'-dicarboxypimelate 39.5 g of potassium hydroxide was dissolved in 1000 L of ethanol. 106.8 g of the title compound of Example 1 was slowly added into the resultant solution. Thereafter, the resultant solution was heated, and refluxed for 24 hours. Ethanol was removed under reduced pressure, and the residual solid was dissolved in 650 mL of distilled water. The resultant solution was extracted by using ether at −5° C., and acidified to about pH 2 by utilizing 50% aqueous hydrochloric acid solution. Ether was removed under reduced pressure, and the resultant solution was fractionally distilled, thereby obtaining the title compound of Chemical Formula 4 as yellow liquid type.

EXAMPLE 3

Synthesis of diethyl-α,α'-dimethylenepimelate 37.9 g of the title compound of Example 2 was added into 100 mL of distilled water at 0° C., and stirred. A dimethylamine gas was passed therethrough. The resultant solution was stirred for 30 hours, and then warm to room temperature. 45 g of 37% aqueous formamide solution was slowly added thereinto. Dimethylamine gas was passed therethrough for one more hour, and the resultant solution was stirred for 8 hours at 30 to 40° C. Thereafter, the resultant solution was separated at room temperature, the organic layer was washed twice by using about 10 mL of concentrated hydrochloric acid solution, and the resultant solution was fractionally distilled, thereby obtaining the title compound of Chemical Formula 5 (yield: 90%, 27 g).

EXAMPLE 4

Synthesis of α,α'-dimethylenepimelic acid 23.3 g of sodium hydroxide was dissolved in 250 mL of distilled water. 70 g of the title compound of Example 3 was slowly added thereinto. The resultant solution was stirred for 36 hours at room temperature, and its temperature was lowered to 0° C. The resultant solution was acidified by using hydrochloric acid, and filtered. The filtered solid was recrystallized in distilled water, thereby obtaining the title compound of Chemical Formula 6a (yield: 81%, 42 g).

EXAMPLE 5

Synthesis of di-tert-butyl α,α'-dimethylenepimelate 18.42 g of the dried compound of Example 4 was dissolved in 500 mL of tetrahydrofuran. 47.6 g of thionyl chloride was slowly added thereinto. Thereafter, the resultant solution was heated and refluxed. After 2 hours, excess thionyl chloride was removed by distillation under reduced pressure. A solution of 29.65 g of tert-butanol and 50.6 g of triethylamine in tetrahydrofuran was slowly added into the resultant solution at −20° C. The resultant solution was heated to 60° C. for about 12 hours, and then tetrahydrofuran and triethylamine were removed under reduced pressure. The resultant solution was diluted with dichloromethane, and washed twice with 10% aqueous sodium bicarbonate solution. The organic layer was concentrated, and purified by a column chromatography using ethyl acetate-hexane eluent, thereby obtaining the title compound of Chemical Formula 7 (yield: 60%, 17.8 g).

EXAMPLE 6

Synthesis of di-1-ethoxyethyl α,α'-dimethylenepimelate

To 500 mL of tetrahydrofuran was added 18.42 g of the dried compound of Example 4 and 10 g of pyridinium 4-toluene sulfonic acid. And 17.3 g of ethylvinylether was slowly added thereinto at 0° C. Thereafter, the resultant solution was reacted for 12 hours at room temperature. Ethylvinylether and tetrahydrofuran were removed under reduced pressure, and the resultant solution was dissolved in ethyl acetate. The resultant solution was washed twice with 10% aqueous sodium bicarbonate solution, dried over magnesium sulfate, filtered, and concentrated under reduced pressure. The column chromatography was performed thereon by using a solution of ethyl acetate and hexane, thereby obtaining the title compound of Chemical Formula 8 (yield: 95%, 31.2 g).

EXAMPLE 7

Synthesis of di-1-ethoxy-1-methyl propyl α,α'-dimethylenepimelate

The procedure of Example 6 was repeated using 20.67 g of ethoxypropene instead of ethylvinylether, thereby obtaining the title compound of Chemical Formula 9 (yield: 85%, 30.3 g).

EXAMPLE 8

Synthesis of di(tetrahydropyran-2-yl) α,α'-dimethylenepimelate

To 500 mL of tetrahydrofuran was added 18.42 g of the dried compound of Example 4 and 10 g of 4-toluene sulfonic acid. And 20.2 g of 2,3-dihydropyran was slowly added thereinto at 0° C. Thereafter, the resultant solution was reacted for 12 hours at room temperature. 2,3-dihydropyran and tetrahydrofuran were removed under reduced pressure, and the resultant solution was dissolved in dichloromethane. Then, the resultant solution was washed twice with 10% aqueous sodium bicarbonate solution, dried over magnesium sulfate, filtered, and concentrated under reduced pressure. The column chromatography was performed thereon by using a solution of ethyl acetate and hexane, thereby obtaining the title compound of Chemical Formula 10 (yield: 72%, 25.37 g).

II. Preparation of Photoresist Polymers

EXAMPLE 9

Preparation of poly(di-tert-butyl $\alpha,\alpha'$-dimethylenepimelate)

To 100 mL of tetrahydrofuran was added 29.64 g of di-tert-butyl ($\alpha,\alpha'$-dimethylenepimelate and 0.2 g of AIBN. The resultant mixture was purged with an Argon gas. Thereafter, the resultant was slowly stirred at 60° C. for about 24 hours under Argon atmosphere. The resultant was precipitated in methanol, filtered, washed several times by using methanol, and dried under reduced pressure at room temperature, thereby obtaining the polymer of Chemical Formula 11 (yield: 80%, 23.7 g).

EXAMPLE 10

Preparation of poly(di-1-ethoxyethyl $\alpha,\alpha'$-dimethylenepimelate)

The procedure of Example 9 was repeated using 32.84 g of di-1-ethoxyethyl $\alpha,\alpha'$-dimethylenepimelate instead of di-tert-butyl $\alpha,\alpha'$-dimethylenepimelate to obtain the polymer of Chemical Formula 12 (27.9 g, yield: 85%).

EXAMPLE 11

Preparation of poly(di-1-ethoxy-1-methylethyl $\alpha,\alpha'$-dimethylenepimelate)

The procedure of Example 9 was repeated using 36.65 g of di-1-ethoxy-1-methylethyl $\alpha,\alpha'$-dimethylenepimelate instead of di-tert-butyl $\alpha,\alpha'$-dimethylenepimelate to obtain the polymer of Chemical Formula 13 (yield: 78%, 27.8 g).

EXAMPLE 12

Preparation of poly[di(tetrahydropyran-2-yl) $\alpha,\alpha'$-dimethylenepimelate]

The procedure of Example 9 was repeated using 35.24 g of di(tetrahydropyran-2-yl) $\alpha,\alpha'$-dimethylenepimelate instead of di-tert-butyl ($\alpha,\alpha'$-dimethylenepimelate to obtain the polymer of Chemical Formula 14 (yield: 72%, 25.37 g).

EXAMPLE 13

Preparation of poly(di-tert-butyl $\alpha,\alpha'$-dimethylenepimelate-co-$\alpha,\alpha'$-dimethylenepimelic acid)

The procedure of Example 9 was repeated using both 23.71 g of di-tert-butyl $\alpha,\alpha'$-dimethylenepimelate and 3.68 g of $\alpha,\alpha'$-dimethylenepimelic acid to obtain the polymer of Chemical Formula 15 (yield: 85%, 23.3 g).

EXAMPLE 14

Preparation of poly(di-1-ethoxyethyl-$\alpha,\alpha'$-dimethylenepimelate-co-$\alpha,\alpha'$-dimethylenepimelic acid)

The procedure of Example 13 was repeated using 26.27 g of di-1-ethoxyethyl $\alpha,\alpha'$-dimethylenepimelate instead of di-tert-butyl $\alpha,\alpha'$-dimethylenepimelate to obtain the polymer of Chemical Formula 16 (yield: 84%, 25.16 g).

EXAMPLE 15

Preparation of poly(di-1-ethoxy-1-methylethyl $\alpha,\alpha'$-dimethylenepimelate-co-$\alpha,\alpha'$-dimethylenepimelic acid)

The procedure of Example 13 was repeated using 28.52 g of di-1-ethoxy-1-methylethyl $\alpha,\alpha'$-dimethylenepimelate instead of di-tert-butyl $\alpha,\alpha'$-dimethylenepimelate to obtain the polymer of Chemical Formula 17 (yield: 75%, 24.15 g).

EXAMPLE 16

Preparation of poly[di(tetrahydropyranyl) $\alpha,\alpha'$-dimethylenepimelate-co-$\alpha,\alpha'$-dimethylenepimelic acid]

The procedure of Example 13 was repeated using 28.19 g of di(tetrahydropyranyl) $\alpha,\alpha'$-dimethylenepimelate instead of di-tert-butyl $\alpha,\alpha'$-dimethylenepimelate to obtain the polymer of Chemical Formula 18 (yield: 80%, 25.5 g).

III. Preparation of Photoresist Composition and Formation of Pattern

EXAMPLE 17

A photoresist composition was prepared by adding by adding 10 g of the polymer prepared in Example 9 and 0.2 g of triphenylsulfonium triflate to 50 g of propylene glycol methyl ether acetate and filtering the resultant solution through a 0.1 $\mu$m filter.

The photoresist composition was spin-coated on a silicon wafer. The coated wafer was soft-baked at 140° C. for 90 seconds, exposed to light using an ArF exposer, post-baked at 140° C. for 90 seconds, and developed in the 2.38 wt % TMAH developing solution for 50 seconds to obtain a ultrafine pattern of 0.15 $\mu$m L/S (see FIG. 1).

EXAMPLE 18

The procedure of Example 17 was repeated using the polymer of Example 10 instead of the polymer of Example 9 to obtain the pattern of 0.15 $\mu$m L/S.

EXAMPLE 19

The procedure of Example 17 was repeated using the polymer of Example 11 instead of the polymer of Example 9 to obtain the pattern of 0.15 $\mu$m L/S.

EXAMPLE 20

The procedure of Example 17 was repeated using the polymer of Example 12 instead of the polymer of Example 9 to obtain the pattern of 0.15 $\mu$m L/S.

EXAMPLE 21

The procedure of Example 17 was repeated using the polymer of Example 13 instead of the polymer of Example 9 to obtain the pattern of 0.15 $\mu$m L/S.

EXAMPLE 22

The procedure of Example 17 was repeated using the polymer of Example 14 instead of the polymer of Example 9 to obtain the pattern of 0.15 µm L/S.

EXAMPLE 23

The procedure of Example 17 was repeated using the polymer of Example 15 instead of the polymer of Example 9 to obtain the pattern of 0.15 µm L/S.

EXAMPLE 24

The procedure of Example 17 was repeated using the polymer of Example 16 instead of the polymer of Example 9 to obtain the pattern of 0.15 µm L/S.

According to the present invention, the polymer is easily prepared by a radical cyclopolymerization. The thusly-prepared photoresist polymer has high transparency and excellent dry etching resistance in the wavelength of 193 nm. In addition, the photoresist polymer has excellent post exposure delay stability and is also stable to variations of the wafer. Moreover, the polymer provides a superior resolution of 0.15 µm. As a result, the photoresist polymer of the present invention can be employed to prepare the photoresist composition suitable for the high integration minute pattern below 0.15 µm (more than 1 G DRAM), and thus a semiconductor device having strong reliability can be manufactured.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A photoresist polymer derived from at least one monomer selected from the group consisting of compounds of Chemical Formulas 2a and 2b:

Chemical Formula 2a

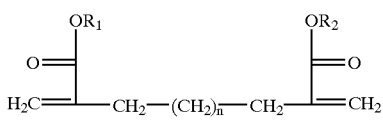

Chemical Formula 2b

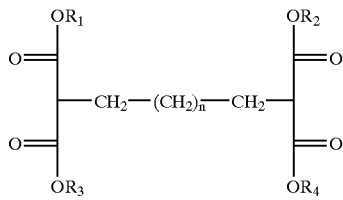

wherein,
  $R_1$ is an acid labile protecting group;
  $R_2$ to $R_4$ are independently H, or an acid labile protecting group; and
  n is an integer from 1 to 3.

2. The photoresist polymer according to claim 1, wherein said acid labile protecting group is selected from the group consisting of a moiety of the formula

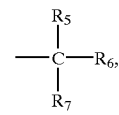

tetrahydropyran-2-yl and tetrahydrofuran-2-yl; wherein $R_5$ to $R_7$ are independently H, $C_1$–$C_3$ alkyl, alkoxy or hydroxyalkyl.

3. The photoresist polymer according to claim 1, which further comprises the monomer of Chemical Formula 19:

Chemical Formula 19

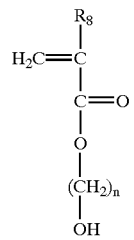

wherein $R_8$ is hydrogen or alkyl, and n is an integer from 1 to 8.

4. The photoresist polymer according to claim 1, which further comprises the monomer of Chemical Formula 6:

Chemical Formula 6

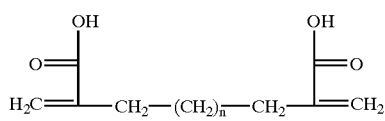

wherein n is an integer from 1 to 3.

5. The photoresist polymer according to claim 1, wherein the molecular weight of said photoresist polymer is in the range of from about 3,000 to about 100,000.

6. The photoresist polymer according to claim 1, which is selected from the group consisting of:
  poly(di(tert-butyl) α,α'-dimethylenepimelate);
  poly(di(1-ethoxyethyl) α,α'-dimethylenepimelate);
  poly(di(1-ethoxy-1-methylethyl) α,α'-dimethylenepimelate);
  poly[di(tetrahydropyran-2-yl) α,α'-dimethylenepimelate];

poly(di(tert-butyl) α,α'-dimethylenepimelate-co-α,α'-dimethylenepimelic acid);

poly(di(1-ethoxyethyl) α,α'-dimethylenepimelate-co-α,α'-dimethylenepimelic acid);

poly(di(1-ethoxy-1-methylethyl) α,α'-dimethylenepimelate-co-α,α'-dimethylenepimelic acid); and poly[di(tetrahydropyran-2-yl)-α,α'-dimethylenepimelate-co-α,α'-dimethylenepimelic acid].

7. A photoresist composition comprising a photoresist polymer of claim 1, an organic solvent and a photoacid generator.

8. The photoresist composition according to claim 7, wherein the photoacid generator is a sulfide or onium type compounds.

9. The photoresist composition according to claim 7, wherein said photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate.

10. The photoresist composition according to claim 7, wherein said photoacid generator is used in an amount in the range of from about 0.05 to about 10% by weight of said photoresist polymer employed.

11. The photoresist composition according to claim 7, wherein the organic solvent is selected from the group consisting of methyl 3-methoxypropionate, ethyl 3-ethoxypropionate, propylene glycol methyl ether acetate, and cyclohexanone.

12. The photoresist composition according to claim 7, wherein the amount of the organic solvent is in the range of from about 100 to about 1000% by weight of said photoresist polymer.

13. A process for forming a photoresist pattern, comprising the steps of:

(a) coating a photoresist composition of claim 7 on a substrate of semiconductor element to form a photoresist film;

(b) exposing said photoresist film to light using a light source; and (c) developing said photoresist film.

14. The process according to claim 13, further comprising a baking step before and/or after exposure of step (b).

15. The process according to claim 14, wherein said baking step is performed at a temperature range about 70 to about 200° C.

16. The process according to claim 13, wherein said light source is ArF, KrF, VUV, EUV, E-beam, X-ray or ion beam.

17. The process according to claim 13, wherein said photoresist film is irradiated with light-exposure energy in the range of from about 1 to about 100 mJ/cm$^2$.

18. A semiconductor element manufactured by the process according to claim 13.

* * * * *